United States Patent
Tei et al.

[11] Patent Number: 6,094,446
[45] Date of Patent: Jul. 25, 2000

[54] WAVELENGTH STABILIZING APPARATUS OF LASER LIGHT SOURCE

[75] Inventors: Daikou Tei, Seto; Naoyuki Mekada, Komaki; Masahiro Kawasugi, Inuyama, all of Japan

[73] Assignee: Santec Corporation, Komaki, Japan

[21] Appl. No.: 09/010,141

[22] Filed: Jan. 21, 1998

[30] Foreign Application Priority Data

Jan. 21, 1997 [JP] Japan .................................. 9-008951

[51] Int. Cl.$^7$ ........................................................ H01S 3/13
[52] U.S. Cl. .................................................. 372/32; 372/38
[58] Field of Search .................................... 372/32, 38

[56] References Cited

U.S. PATENT DOCUMENTS

| | | | |
|---|---|---|---|
| 4,103,254 | 7/1978 | Chikami | 372/32 |
| 4,309,671 | 1/1982 | Malyon | 372/32 |
| 4,450,565 | 5/1984 | Copeland | 372/32 |
| 4,485,475 | 11/1984 | Large et al. | 372/32 |
| 4,821,273 | 4/1989 | Hori | 372/32 |
| 4,856,009 | 8/1989 | Hall et al. | 372/32 |
| 4,897,843 | 1/1990 | Scott | 372/32 |
| 4,957,371 | 9/1990 | Pellicoi et al. | |
| 5,412,676 | 5/1995 | Schnier et al. | 372/32 |
| 5,798,859 | 8/1998 | Colbourne et al. | 372/32 |
| 5,867,513 | 2/1999 | Sato | 372/32 |

FOREIGN PATENT DOCUMENTS

| | | |
|---|---|---|
| 56-103551 | 8/1981 | Japan . |
| 60-74687 | 4/1985 | Japan . |
| 62-119993 | 6/1987 | Japan . |
| 4-157780 | 5/1992 | Japan . |
| 4-126201 | 11/1992 | Japan . |
| 4-349678 | 12/1992 | Japan . |
| 5-55683 | 3/1993 | Japan . |
| 6-281812 | 10/1994 | Japan . |
| 7-92530 | 10/1995 | Japan . |

*Primary Examiner*—Rodney Bovernick
*Assistant Examiner*—Robert E. Wise
*Attorney, Agent, or Firm*—McDermott, Will & Emery

[57] ABSTRACT

The light emitted by the laser diode 1 is put into an interference optical filter 5. The light passing through the interference optical filter 5 and the reflected light are respectively received in photo diodes PD1, PD2. Their output ratio is calculated by an adder 13, a subtracter 14, and a divider 15, and a wavelength signal is obtained. The difference of the output ratio and reference value is detected as error signal by an error detector 16, and the emission wavelength of the laser diode 1 is controlled so that the error signal may be zero.

16 Claims, 11 Drawing Sheets

WAVELENGTH STABILIZING APPARATUS OF LASER LIGHT SOURCE

FIELD OF THE INVENTION

The present invention relates to a wavelength stabilizing apparatus for stabilizing the wavelength of laser light source of semiconductor laser or the like used in optical communication, optical information processing, optical measurement, etc.

PRIOR ART

In optical communication, at the present, by multiplexing lights of multiple wavelengths in an optical fiber and transmitting, a wavelength division multiplex communication system is being studied in order to increase the quantity of transmission substantially as compared with the case of using light of single wavelength. To realize the wavelength division multiplex communication, the wavelength of the laser light source must be stabilized sufficiently in order to transmit laser lights of multiple wavelengths within a relatively narrow wavelength band capable of amplifying the optical signal directly, for example, at an interval of 1 nm or less. Moreover, in optical information processing or optical measurement, the stabilization of wavelength of the laser light source is an important subject for enhancing the density of information and improving the precision of measurement.

To stabilize the emission wavelength of the laser light source, for example, using an element having a reference wavelength characteristic by some way or other, an error from the emission wavelength is detected, and is fed back to the laser light source. Up to now, using the atom or molecule absorption as the reference, an apparatus for stabilizing the wavelength, and methods of adjusting wavelength by modulating the wavelength of reference light or light source by dither, using holography, grating, Mach-Zehnder interferometer or Fabry-Perot interferometer have been known. Dither is to oscillate the light wavelength slightly by some way, so that the difference from the reference wavelength and direction may be distinguished. By feeding back the distinguishing result to the laser light source, the emission wavelength is stabilized. It is also known to stabilize the emission wavelength of laser light source by using multilayer interference optical filter or an etalon as reference wavelength.

In such conventional methods, however, the light of the light source such as a laser diode is modulated by changing the emission wavelength by giving a delicate change to the light source by the dither, judging the wavelength changing direction electrically, and detecting the difference from the reference to feed back to the light source. It is hence possible to overlap with the modulation signal as information. To eliminate such effects of the dither, a low pass filter or an electric filter is indispensable. Besides, the control system is complicated because of the dither, and if the dither is accompanied by movable parts, the reliability is low and the life is shortened.

As proposed in Japanese Laid-open Patent No. 60-74687, the light from a semiconductor laser is separated with a beam splitter, the levels of light passing through two filters slightly different in wavelengths of transmission are detected by photoelectric converters, and the light intensity ratio is detected and fed back to the semiconductor laser so that the ratio may be constant.

The method requires the beam splitter or the like for splitting the light. However, the beam splitter is influenced by polarization of light, likely to change in the spectral ratio

2 by temperature, and difficult to produce an element capable of splitting the light stably at a specific ratio ideally. As for the filters, it has been also known difficult to manufacture two optical filters slightly different in transmission wavelengths.

SUMMARY OF THE INVENTION

The invention is devised in the light of the problems of the prior arts, and it is hence an object thereof to present a wavelength stabilizing apparatus of laser light source capable of emitting laser light of specified wavelength accurately in a very simple constitution without modulating the wavelength by the dither.

In the wavelength stabilizing apparatus of the invention, a laser light source emits light, and this laser light is put into an optical filter. This filter passes light of specific wavelength and reflects others, and the transmitted light and the reflected light are respectively received by first and second photo detectors, and their output ratio is calculated by output ratio calculator. By controlling the emission wavelength of the laser light source so that the output ratio may be a specified value, a laser light of specific wavelength can be emitted.

Such optical filter can be realized by an interference optical filter by a multilayer film. The multilayer film interference optical filter may be an interference optical filter of variable wavelength type composed so that the transmission wavelength may change by changing the incident position of laser light continuously in a specific direction. In this case, the emission wavelength of the laser light source can be changed. A difference between the output ratio calculated by the output ratio calculator and a reference value is detected as an error by error detector. By controlling the laser light source by light source driver so that the error may be 0, fine adjustment of emission wavelength of the laser light source is realized. By installing a cut filter between the light source and the optical filter, only one slope portion of characteristic of the optical filter may be defined as a lock point.

BRIEF DESCRIPTION OF THE DRAWINGS

FIG. 3($a$) is a sectional view showing a constitution of an interference optical filter of single cavity structure according to the first and second embodiments of the invention, (b) is a graph showing changes of transmittance on the x-axis, and (c) is a magnified sectional view of the circular portion in (a).

FIGS. 4($a$)–4($e$) are graphs showing characteristic changes in terms of emission wavelength of a cut filter, an interference optical filter, and photo diodes PD1 and PD2.

FIGS. 6($a$)–6($d$) are perspective views showing a constitution of a wavelength control device according to the second embodiment.

DESCRIPTION OF THE PREFERRED EMBODIMENTS

Figure 1:
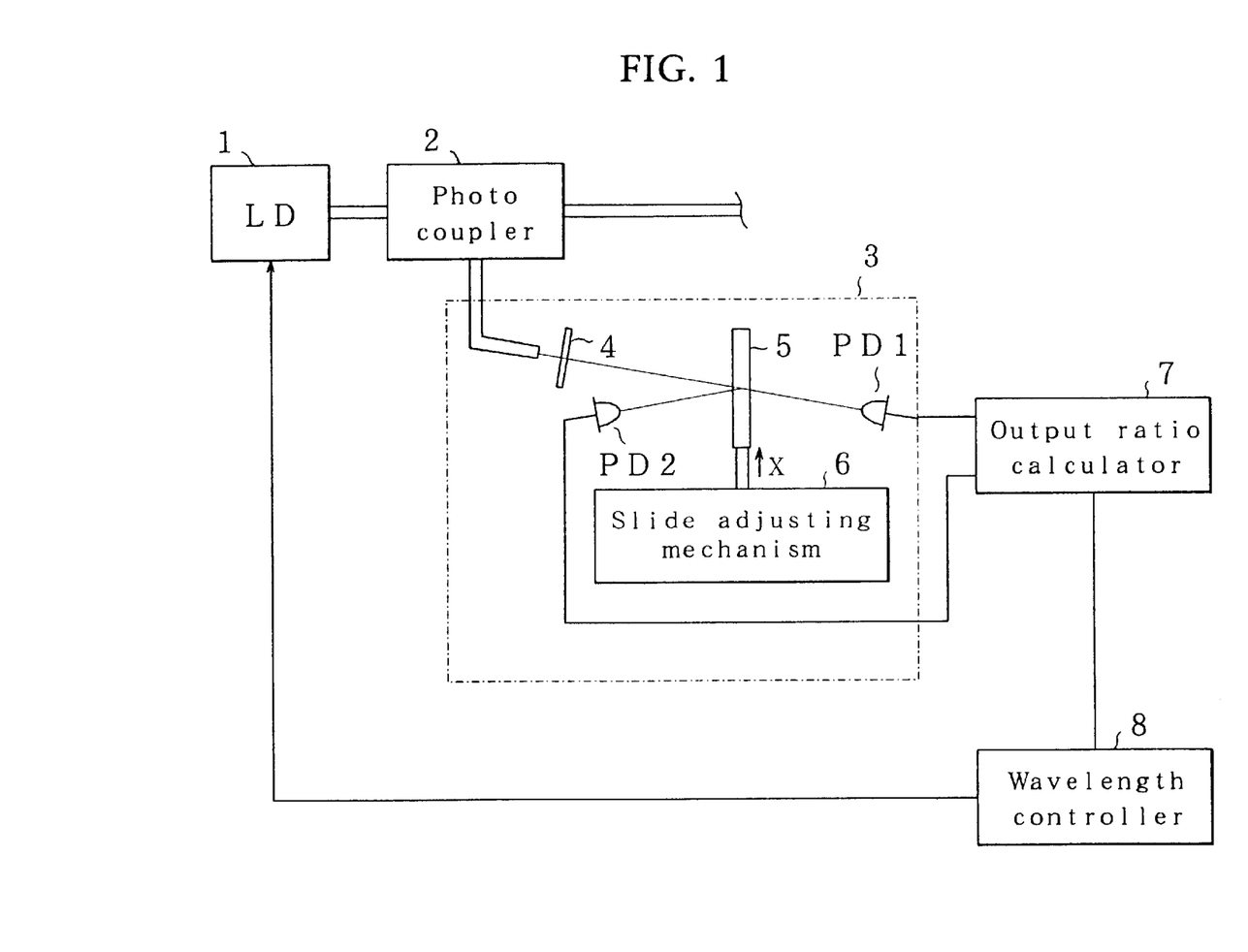
FIG. 1 is a block diagram showing an entire constitution of a wavelength stabilizing apparatus of light source in a first embodiment of the invention.

FIG. 1 is a block diagram showing an entire constitution of a wavelength stabilizing apparatus in a first embodiment of the invention. In the diagram, the laser light source in the embodiment is a laser diode (LD) 1 of distributed feedback type, which emits laser light of one line spectrum. The emission wavelength of this laser light source can be controlled from outside in a range of, for example, 2 to 3 nm by current or temperature control. This laser light is guided into a photo coupler 2. The photo coupler 2 splits part of incident light, and passes the remainder so as to split the light into light source for communication or for measurement, and the split light is given to a light splitter 3. These devices may be coupled by optical fiber, or may be connected directly in space. The light splitter 3 includes a cut filter 4 for cutting off part of the incident light as shown in the diagram, and the light passing through the cut filter 4 is given to an optical filter, such as an interference optical filter 5. The interference optical filter 5 is designed to change continuously the passing wavelength depending on the incident position. A slide adjusting mechanism 6 is to slide this interference optical filter 5 mechanically in a small distance in the x-axis direction, which is parallel to the surface of the optical filter 5. The wavelength of the light passing through the interference optical filter 5 can be continuously changed by the slide adjusting mechanism 6.

At a position of the laser light passing through the interference optical filter 5, a first photo detector, for example, a photo diode PD1 is disposed, and at a position of receiving the light reflected from the interference filter 5, a photo diode PD2 is disposed as a second photo detector. The outputs of these photo diodes PD1 and PD2 are given to output ratio calculator 7. The output ratio calculator 7 is to calculate the output ratio of the photo diodes PD1 and PD2, and its output is given to a wavelength controller 8. The wavelength controller 8 is to control the emission wavelength of the laser light source so that the output ratio by the output ratio calculator 7 may be a specified value. The emission wavelength of the laser light source 1 is controlled by changing the driving current of the laser diode 1, or changing the ambient temperature.

Thus, by using the interference optical filter, the emission wavelength of the light source is controlled by the ratio of incident light and reflected light. Accordingly, it is not necessary to use the beam splitter which is difficult to keep the spectral ratio accurately and constantly as in the conventional wavelength control method, and temperature control is not necessary. Also it is not needed to use two filters only slightly different in the wavelength selecting characteristic. Therefore, accurate wavelength control is possible in a very simple constitution.

Figure 2:
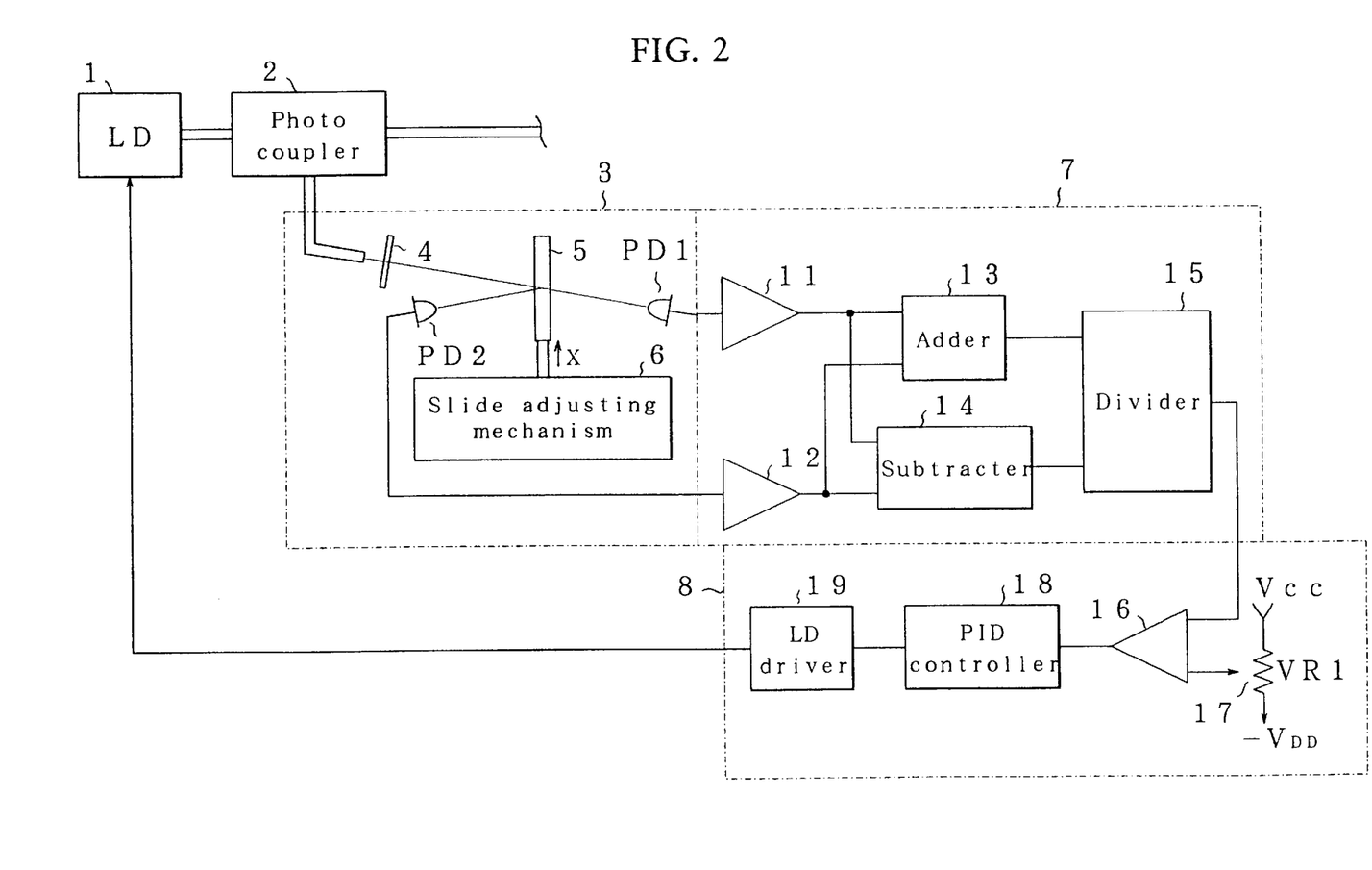
FIG. 2 is a block diagram showing an entire constitution of a wavelength stabilizing apparatus of light source in a second embodiment of the invention.

A second embodiment of the invention is described below. In this embodiment, the output ratio calculator 7 and wavelength controller 8 are described more specifically. The constitution up to the light splitter 3 is same as in the first embodiment, and detailed description is omitted. In this embodiment, outputs from the first and second photo diodes PD1, PD2 of the light splitter 3 are given to I/V converters 11, 12 in the output ratio calculator 7, and converted into voltage signals. The outputs of the I/V converters 11, 12 are given to an adder 13 and a subtracter 14, and their outputs are added and subtracted and given to a divider 15. The divider 15 normalizes the light quantity level split by the photo coupler 2, and detects the wavelength of input light on the basis of their output ratio. Herein, the I/V converters 11, 12, the adder 13, the subtracter 14, and the divider 15 compose the output ratio calculator 7 for detecting the wavelength of laser light by the output ratio of the first and second photo detectors, and its output is given to one end of an error detector 16. A reference voltage is given to the other input end of the error detector 16. This reference voltage is designed to be adjusted in a range of $+V_{cc}$ to $-V_{DD}$ by a reference value adjuster 17, for example, a variable resistor VR1. The error detector 16 detects the difference between this reference voltage and input voltage as an error signal, and gives the error signal to a PID controller 18. The PID controller 18 is responsible for PID control so that the error signal may be 0, and its output is fed back to the laser diode 1 through a laser diode driver 19. The laser diode driver 19 controls the current flowing in the laser diode 1, or the temperature of the laser diode 1, and controls to change the emission wavelength of the laser diode 1 in a range of, for example, 2 to 3 nm or less. Herein, the error detector 16, the variable resistor VR1 for giving the reference voltage to the error detector 16, the PID controller 18, and the laser diode driver 19 compose the wavelength control for 8 for controlling the emission wavelength of the laser light source so that the output ratio by the output ratio calculator 7 may be a specified value.

Figure 3A:
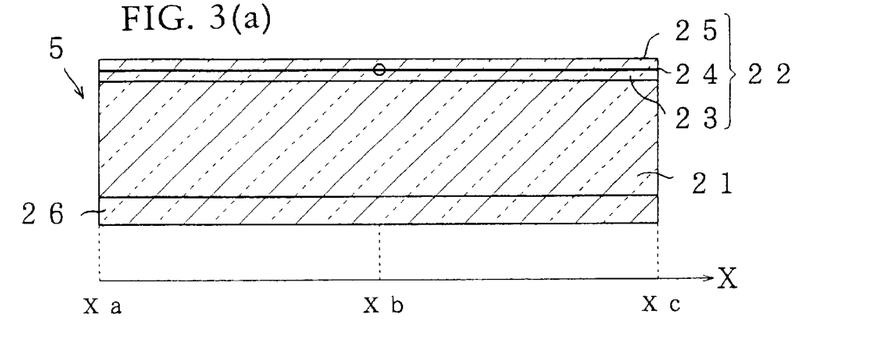
Figure 3B:
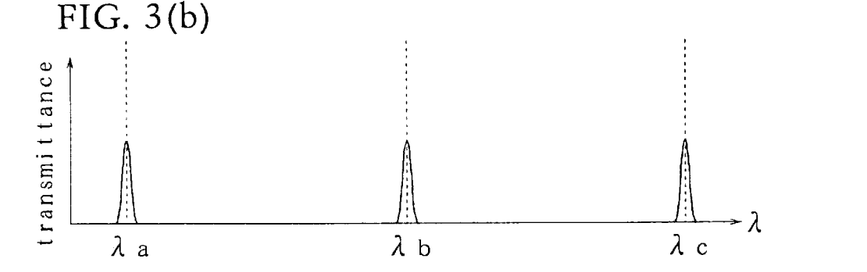

The interference optical filter 5 is, as disclosed in U. S. Pat. No. 4,957,371, issued to Pellicori et al., designed to change continuously the optical thickness of the passing wavelength, by alternately laminating high refractive index films and low refractive index films. The interference optical filter 5 used in the embodiment is explained by referring to FIG. 3. The interference optical filter 5 of wavelength variable type of the embodiment is composed by evaporating multiple layers of substance on a substrate 21 of glass, silicon, etc. The substrate 21 is made of a material high in transmittance of light in a range of practical wavelength, and dielectric or semiconductor is used. In this embodiment, quartz glass is used. On the substrate 21, a multilayer film 22 of vapor deposition substance, such as dielectric, semiconductor or others high in light transmittance in the practical wavelength range is evaporated. The multilayer film 22 is composed of, as shown in the diagram, a lower layer 23, a cavity layer 24, and an upper layer 25. On the bottom surface of the substrate 21, an anti-reflection film 26 is formed by evaporation.

Herein, substances used as vapor deposition materials for the multilayer film 22 and anti-reflection film 26 are, for example, $SiO_2$ (refractive index n=1.46), $Ta_2O_5$ (n=2.15), Si (n=3.46), $Al_2O_3$, $Si_2N_4$, MgF, and so on. In this embodiment, the multilayer films 23 and 25 are formed by laminating and evaporating low refractive index films and high refractive index films alternately. Herein, the relation of film thickness d, transmission wavelength $\lambda$, and refractive index is n defined as follows.

$$\lambda = 4nd \tag{1}$$

That is, the optical thickness nd of each layer is $\lambda/4$. By alternately laminating low refractive index films and high refractive index film, the full width at half maximum (FWHM) of peak of transmittance is decreased. The relation of film thickness $d_c$ of cavity layer 24, transmission wavelength λ, and refractive index n is defined as follows.

$$\lambda = 2nd_c \quad (2)$$

That is, the optical thickness $nd_c$ of the cavity layer 24 is λ/2.

Figure 3C:
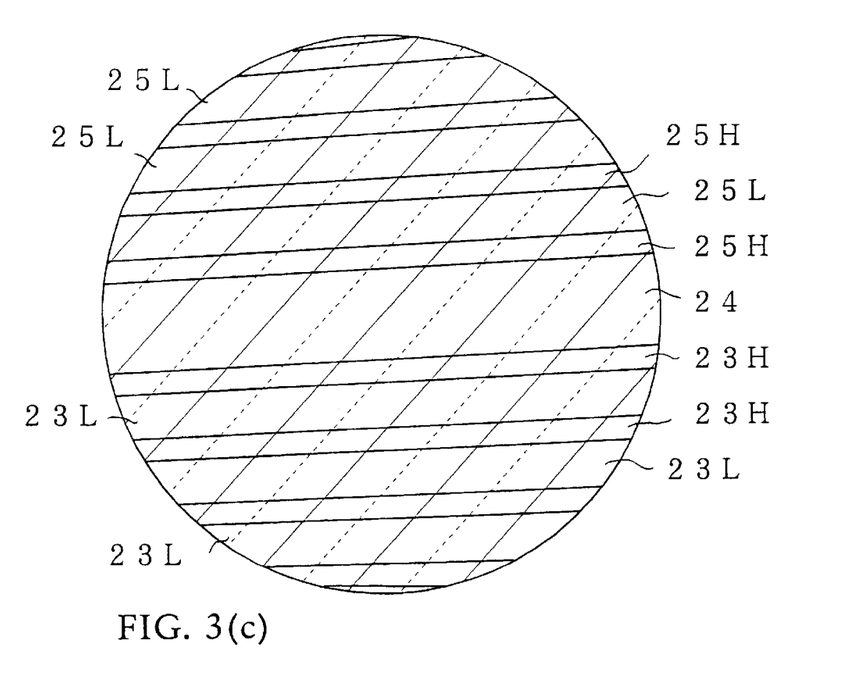

Since the interference optical filter 5 of the embodiment has the relation of the transmission wavelength and film thickness as defined in formulas (1) and (2), the substrate 21 is a slender plate, the refractive indexes of the multilayer film 22 are constant, and the film thickness is changed continuously, so that the transmission wavelength λ may vary. The transmission wavelength of this wavelength variable type interference optical filter 5 is $\lambda_a$ to $\lambda_c$ ($\lambda_a < \lambda_c$), and the transmission wavelength at the middle point ($x = x_b$) is $\lambda_b$. The upper and lower multilayer films 23, 25 are composed by alternately laminating respectively a first vapor deposition substance films of a first refractive index ni and a second vapor deposition substance films of a second refractive index $n_2$ lower than the refractive index $n_1$. That is, as the circular portion in FIG. 3(a) is magnified in FIG. 3(c), each film thickness is changed continuously. In FIG. 3(c), the low refractive index films of the lower multilayer film 23 are supposed to be 23L and high refractive index films to be 23H, and the low refractive index films of the upper multilayer film 25 are supposed to be 25L and high refractive index films to be 25H. For the transmission wavelength $\lambda_a$ of the end portion $x_a$ on the x-axis of the filter in FIG. 3(a), it is set to establish the formulas (1) and (2) in the low refractive index films and high refractive index films, respectively. Similarly, for the transmission wavelengths $\lambda_b$, $\lambda_c$ at positions $x_b$, $x_c$ on the substrate 21, the film thickness is set so as to establish the formulas (1) and (2) at the wavelengths $\lambda_b$, $\lambda_c$. Therefore, each film thickness of the layer changes continuously from position $x_a$ to $x_c$ on the x-axis as shown in the diagram, and the film thickness increases toward the positive direction of the x-axis.

Such continuous change of film thickness is realized by disposing the substrate obliquely so as to change continuously the interval to the evaporation source, when evaporating and forming the multilayer film 22 on the substrate 21.

Instead of changing continuously the film thicknesses of the interference optical filter 5, while keeping the film thicknesses constant, the refractive indexes $n_1$, $n_2$ of the multilayer film 22 may be changed continuously in the x-axis direction, so that the optical thicknesses may be varied continuously.

Thus constituted interference optical filter 5 has a light transmission characteristic in a narrow band, and has a sufficiently stable characteristic against temperature changes. Therefore, by moving the incident position of the light in the interference optical filter 5 in the x-axis direction by using the slide adjusting mechanism 6, the transmission wavelength itself may be changed continuously.

Figure 4A:
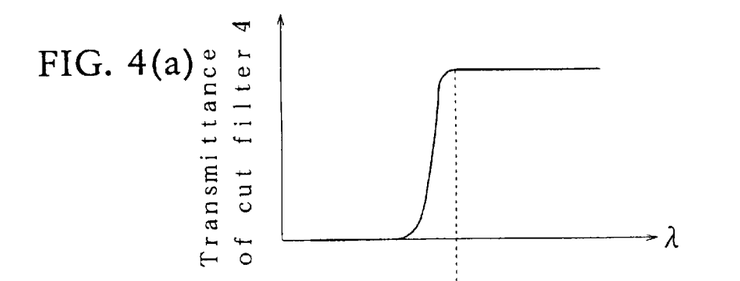
Figure 4B:
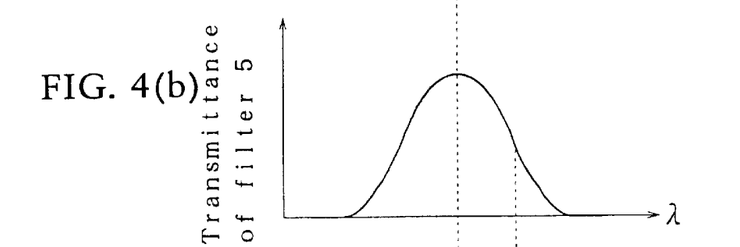
Figure 4C:
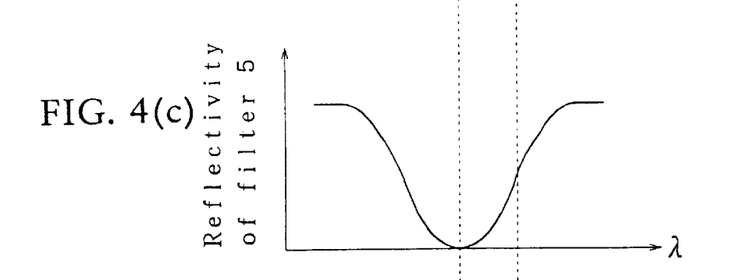
Figures 4D, 4E:
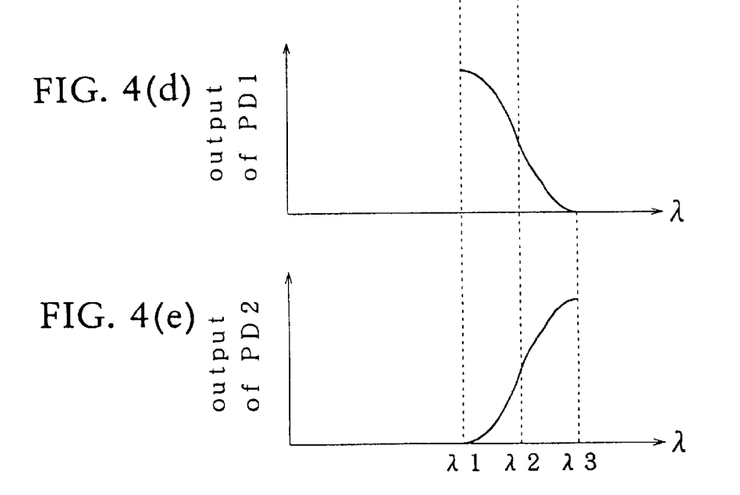

The operation of the wavelength stabilizing apparatus in this embodiment is described below. FIG. 4(a) is a graph showing the light transmission characteristic of the cut filter 4, and FIG. 4(b) and FIG. 4(c) are graphs showing the transmittance and reflectivity characteristics of the interference optical filter 5. As clear from these graphs, the cut filter 4 selects such characteristic as to pass light of longer wavelength than the center wavelength of the interference optical filter 5, and cut off light of shorter wavelength. The interference optical filter 5 passes light of specified wavelength λ1, and reflects other light as shown in FIG. 4(c). At this time, for the emission wavelength λ of the laser diode 1, the light outputs obtained in the photo diodes PD1, PD2 are as shown in FIGS. 4(d), (e), respectively. The outputs obtained in the diodes PD1, PD2 correspond to the transmittance in FIG. 4(b) and reflectivity in FIG. 4(c), respectively.

Figure 5:
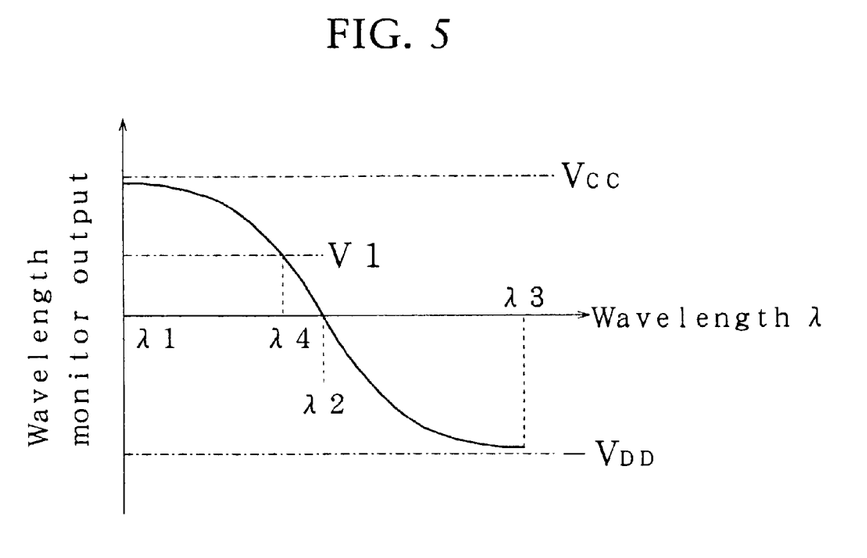
FIG. 5 is a graph showing changes of error signal in terms of wavelength.

Therefore, supposing the I/V conversion outputs of the photo diodes PD1, PD2 to be A and B, they are added, subtracted, and divided in the divider 15, and (A−B)/(A+B) is calculated. The level normalized by dividing is as shown in FIG. 5. Thus, in a range of wavelength λ1 to λ3, the wavelength monitor signal changes continuously depending on the emission wavelength of the laser light source. Therefore, detecting the differential value of the level of the wavelength monitor signal and the reference voltage of the error detector 16 as error signal, and controlling to nullify the error signal, the wavelength of the laser diode 1 may be controlled so as to coincide with the reference voltage set in the error detector 16. For example, supposing the reference voltage to be 0 V, when the output levels of PD1, PD2 are equal at wavelength λ2 in emission, the error signal is 0, so that the emission wavelength of the laser diode may be controlled at λ2. By setting the reference voltage at level V1 in FIG. 5, the wavelength is locked at the shorter wavelength side of λ4. By such adjustment of the reference voltage of the adjuster 17, the emission wavelength of the laser light source may be finely adjusted in a range of wavelengths λ1 to λ3 as shown in FIG. 4 and FIG. 5.

Figure 6A:
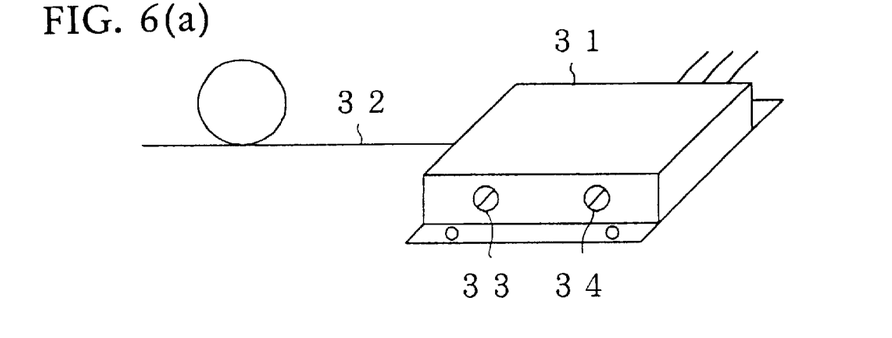

FIG. 6(a) is a perspective view showing a state of accommodating the light splitter 3, the output ratio calculator 7, and the wavelength controller 8 of the wavelength stabilizing apparatus of the invention into one case 31. In this embodiment, by the photo coupler 2 not shown, part of laser light enters the case 31 through an optical fiber 32, and a signal is delivered from the laser diode driver 19. It is designed to adjust from outside of the case by installing an adjusting knob 33 of slide adjusting mechanism 6, and a setting knob 34 of reference voltage by variable resistor VR1.

To change the emission wavelength largely, by tuning the adjusting knob 33 of the slide adjusting mechanism 6 and changing the incident position of the incident light into the interference optical filter 5, the transmission wavelength λ of the interference optical filter 5 shown in FIGS. 4(b), (c) can be changed. In this case, as the cut filter 4, a filter having a corresponding characteristic is used. Thus, the emission possible wavelength can be changed largely. Hence, by roughly adjusting the emission wavelength by the input position into the interference optical filter 5, and finely adjusting the wavelength by changing the reference voltage of the reference voltage adjuster 17, the user can set at a desired wavelength. Thus, in the invention, by using one optical element only, the wavelength can be controlled accurately without using beam splitter or two filters having slightly different transmission wavelengths.

Figures 6B, 6C:
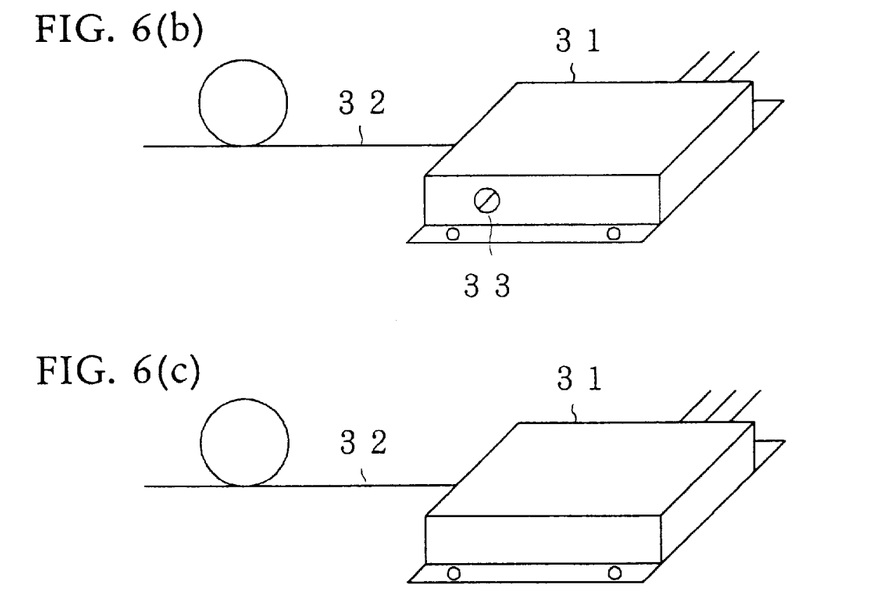

In the second embodiment, it is designed to adjust the knobs 33, 34 of the slide adjusting mechanism 6 and variable resistor VR1 from outside of the case, but as shown in FIG. 6(b), it may be also designed to change the wavelength by the knob 33 of the slide adjusting mechanism 6 only, without using reference voltage adjuster by variable resistor VR1 as shown in FIG. 6(b).

Alternatively, as shown in FIG. 6(c), by setting at a required wavelength at the time of manufacture, it may be designed to prohibit adjustment of emission wavelength of the laser light source without exposing the knob 33 for the slide adjusting mechanism 6 and the knob 34 of the variable resistor for fine adjustment outside of the case. Thus, without demanding the user to adjust the wavelength, a stabilizing apparatus stabilized in the emission wavelength of the laser light source in a very simple constitution is realized, and airtight sealing is also easy.

Figure 6D:
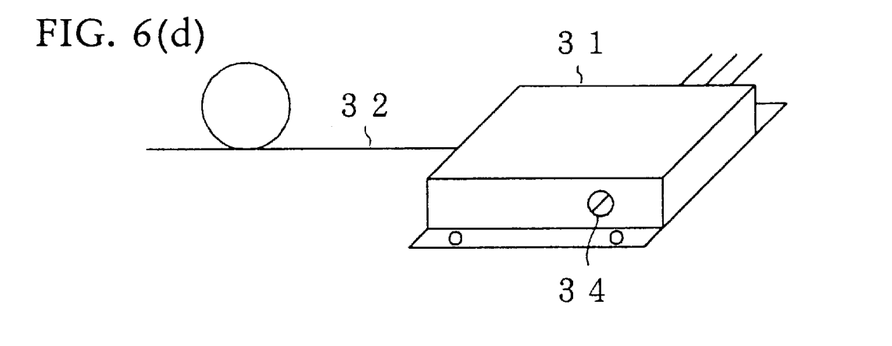

Or, without exposing the knob 33 of the slide adjusting mechanism 6 outside of the case 31, as shown in FIG. 6(d), only the knob 34 of variable resistor for fine adjustment may be available for adjustment. In this case, by setting to the required wavelength by the slide adjusting mechanism at the time of manufacture, the user can finely adjust the emission wavelength in a specified range of set wavelength.

Figure 7:
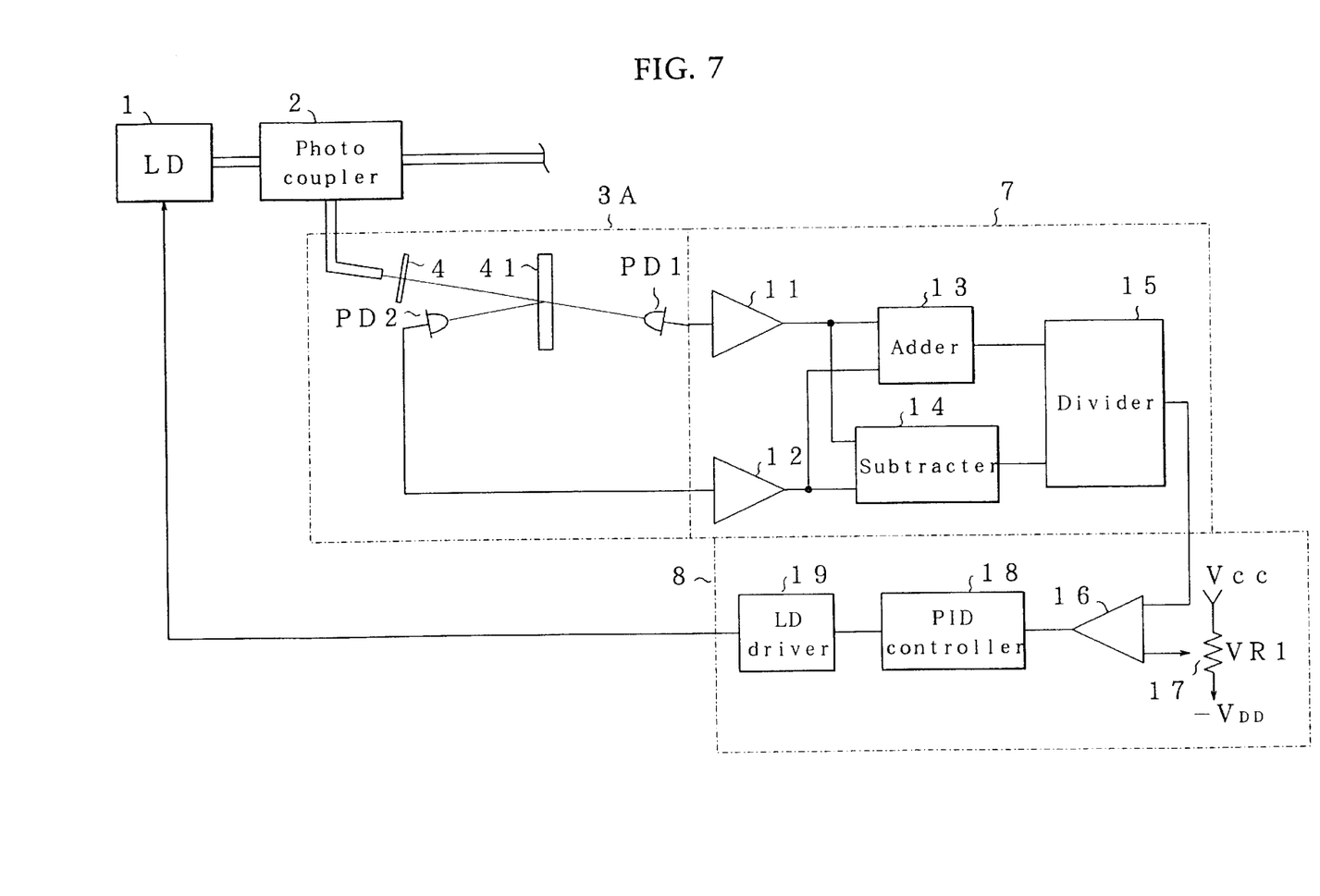
FIG. 7 is a block diagram showing an entire constitution of a wavelength stabilizing apparatus of light source in a third embodiment of the invention.

A third embodiment of the invention is described by referring to FIG. 7. In the third embodiment, instead of the interference optical filter 5 capable of continuously changing the transmission light by the incident position, an ordinary interference optical filter for passing light of a specific wavelength is used. FIG. 7 is a block diagram showing an entire constitution of a wavelength stabilizing apparatus of laser light source according to the third embodiment, and same parts as in the first and second embodiments are identified with same reference numerals and detailed description is omitted. In this embodiment, instead of the interference optical filter 5, an interference optical filter 41 for passing light of specified wavelength is disposed in a wavelength splitter 3A. In this case, the slide adjusting mechanism 6 is not necessary. The emission wavelength of the laser diode 1 is matched nearly with the transmission characteristic of the interference optical filter 41. In this embodiment 3, if the adjusting range of the emission wavelength is within 2 to 3 nm, the emission wavelength can be finely adjusted by the reference voltage set by the reference voltage adjuster 17.

Figure 8:
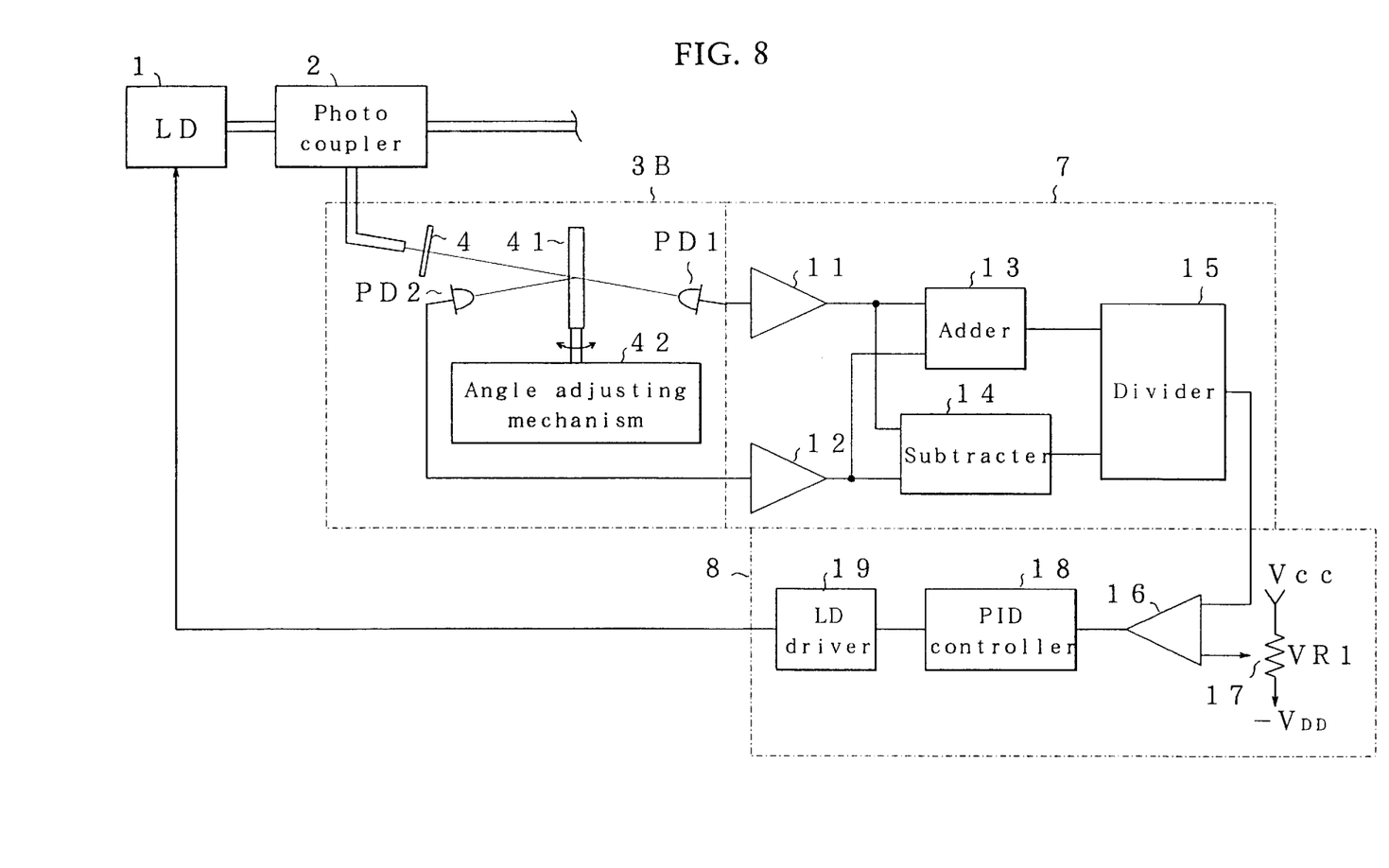
FIG. 8 is a block diagram showing an entire constitution of a wavelength stabilizing apparatus of light source in a forth embodiment of the invention.

A forth embodiment of the invention is described by referring to FIG. 8. FIG. 8 is a block diagram showing an entire constitution of a wavelength stabilizing apparatus of laser light source according to the third embodiment, and same parts as in the third embodiment are identified with same reference numerals and detailed description is omitted. In this embodiment, instead of the wavelength splitter 3A, a wavelength splitter 3B is used. In the wavelength splitter 3B, an angle adjusting mechanism 42 for adjusting the angle of the interference optical filter 41 is provided in order to change the emission wavelength in a wider range. The angle adjusting mechanism 42 is intended to vary the transmission wavelength λ continuously depending on the incident angle of the light entering the interference optical filter 41 after passing through the cut filter 4. In this case, in order to receive the reflected light accurately, the position of the second photo detector PD2 is preferably changed depending on the angle of the interference optical filter 41. If this angle is set too large, the transmission level varies between P polarized light and S polarized light, and it is hence necessary to set within, for example, 5 degrees. When the incident angle of the incident light is set near zero, the effect of change of light intensity due to polarized components can be decrease, but the shape of the optical system for receiving the reflected light is increased in size. Therefore, the angle adjusting mechanism 42 sets the incident angle in a range of about 0 to 5 degrees, and it is preferred to adjust the position and direction of the photo diode PD2 so as to receive the reflected light depending on the incident angle.

Figure 9:
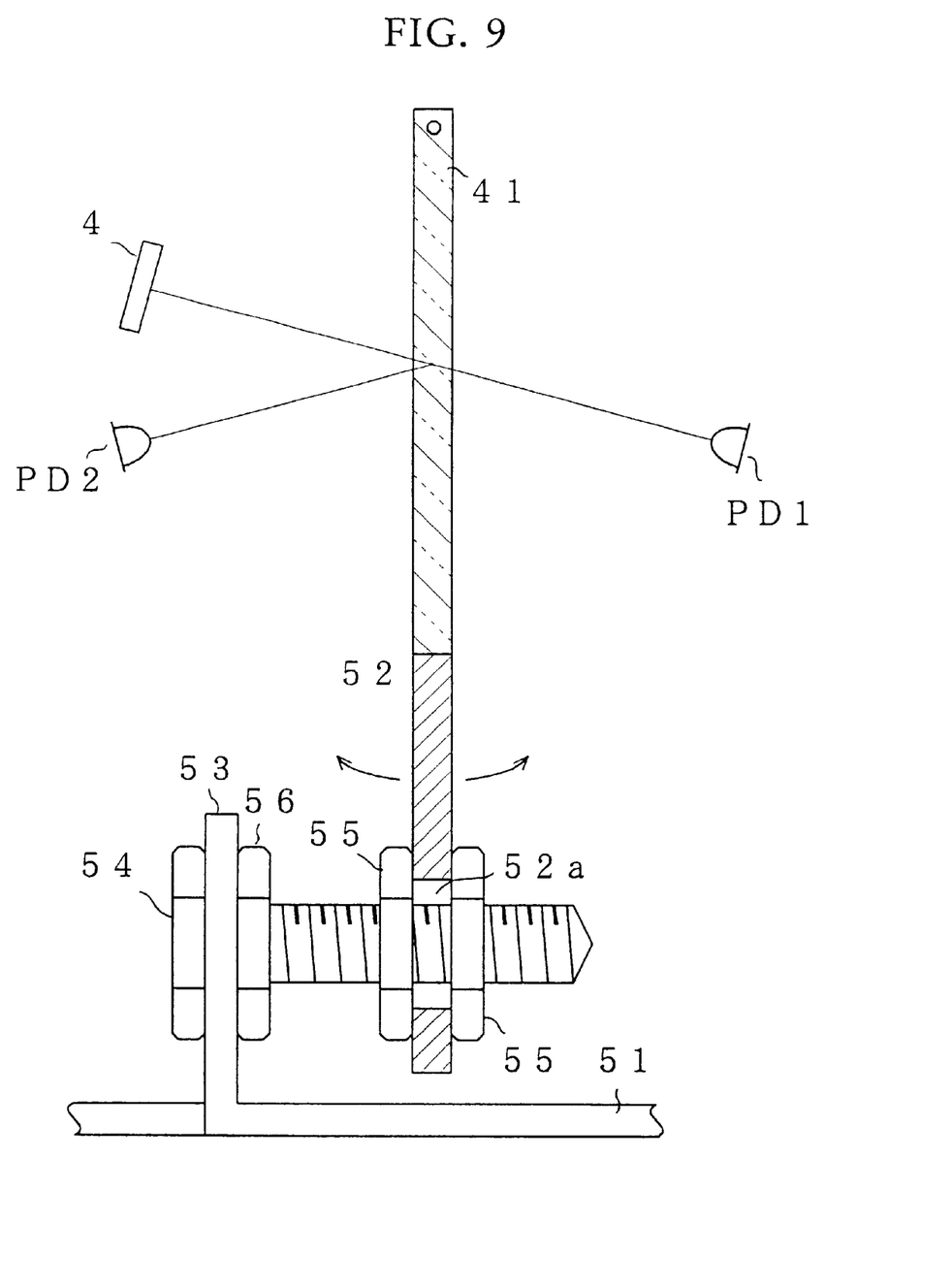
FIG. 9 is a block diagram showing an entire constitution of a wavelength stabilizing apparatus of light source in a fifth embodiment of the invention.

FIG. 9 shows an example of the angle adjusting mechanism of the forth embodiment. In FIG. 9, an upper edge of the optical filter 41 is rotatably connect with a case 51 and a lower portion of the optical filter 41 is connected with a connecting plate 52, and the connecting plate 52 has a hole 52a. At the side of the connecting plate 52, a plate 53 is fixed in the case 51 of the apparatus. In the plate 53, a long bolt 54 is fixed toward the connecting plate 52 and penetrates the hole 52a by a nut 56. The connecting plate 52 is fixed at an arbitrary position with the bolt 54 and nuts 55 from both surface of the plate 52. Then the angle of the filter 41 can be adjusted by the tightened position.

In the forth embodiment, the angle of the interference optical filter 41 and photo diode PD2 is changed by the angle adjusting mechanism 42, but it is technically difficult to adjust them simultaneously. Therefore, after adjusting to a specified angle when setting the specific wavelength, the photo diode PD2 may be fixed. In this case, the emission wavelength can be finely adjusted by the setting of variable resistor VR1.

Figure 10:
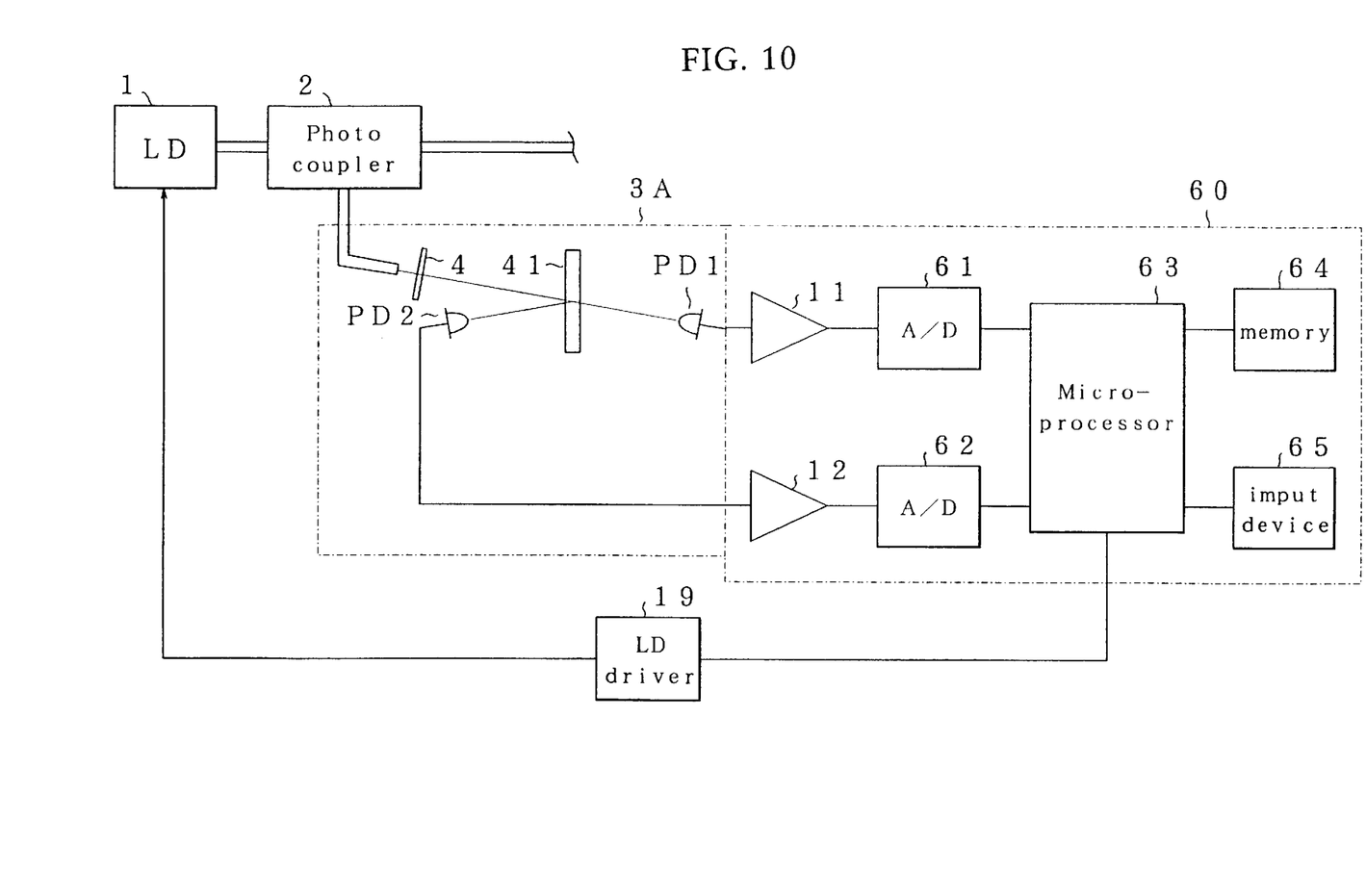
FIG. 10 is a side view showing an angle adjusting mechanism of the fifth embodiment.

A fifth embodiment of the invention is described by referring to FIG. 10. In the fifth embodiment, instead of the output ratio calculator 7 and the wavelength controller 8 of the embodiments 1 and 2, a processing unit 60 is used for controlling the wavelength of the laser diode 1. FIG. 10 is a block diagram showing an entire constitution of a wavelength stabilizing apparatus of laser light source according to the fifth embodiment, and same parts as in the first to third embodiments are identified with same reference numerals and detailed description is omitted. In this embodiment, the output signal of the I/V converters 11 and 12 are fed to A/D converters 61 and 62, respectively. The converted digital signals A1, and B1 are fed to a microprocessor 63. A memory 64 and an input device 65 such as a keyboard are connected to the microprocessor 63. The microprocessor 63 reads the converted signals and calculates control value according to following steps, and controls the LD driver 19.

Figure 11:
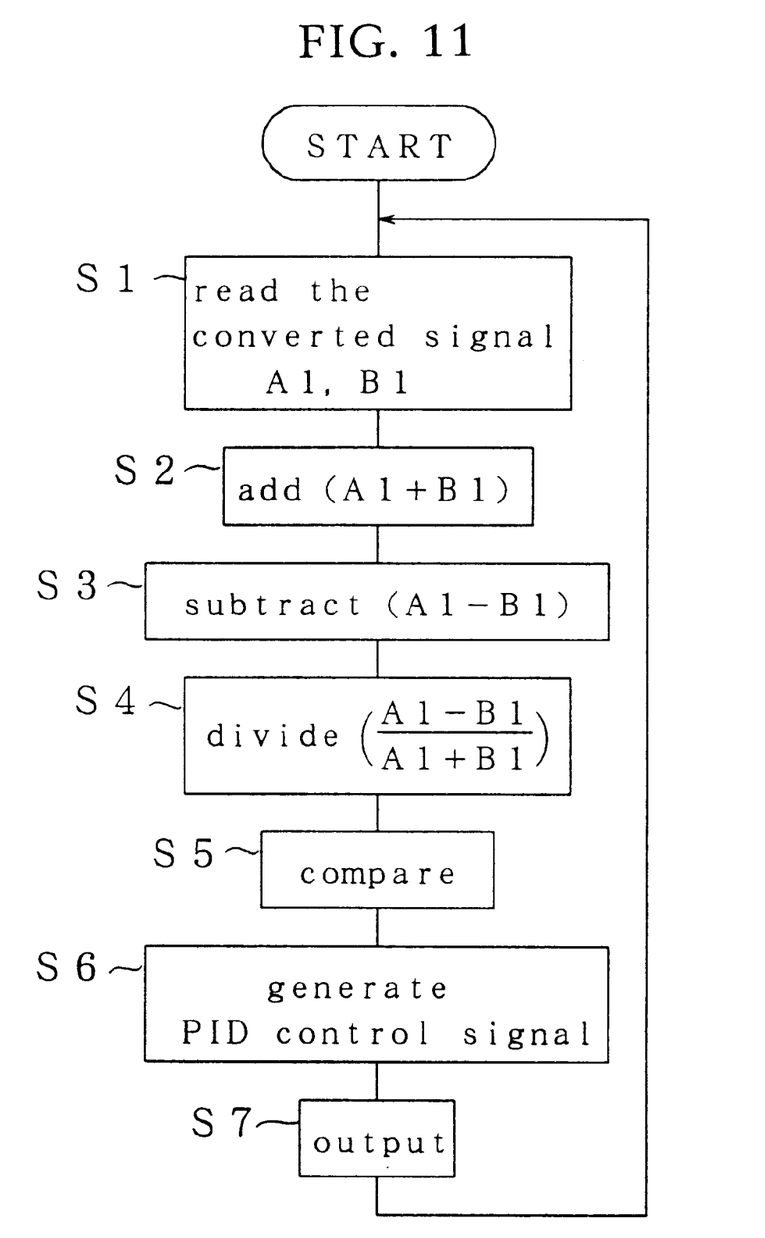
FIG. 11 is a flow chart showing the operation of a processing unit of the fifth embodiment.

FIG. 11 shows the operation of the microprocessor 63. In a step S1, the microprocessor 63 receives the converted signal A1 and B1 of the A/D converters 61 and 62. In steps S2 and S3, the microprocessor 63 adds and subtracts the values A1 and B1. In step S4, the microprocessor 63 divides the values and obtains (A1−B1)/(A1+B1). Then in a step S5, the microprocessor 63 compares the divided value to the predetermined reference value and obtains a error value. Then in a step S6, the microprocessor 63 generates a control signal such as PID control signal based on the error value. And finally in a step S7, the microprocessor 63 outputs the control signal to the LD driver 19.

In the foregoing second to forth embodiments, as the signal processing circuit, the adder, the subtracter, and the divider for calculating their output ratio are provided, but it may be also constituted to calculate the ratio of two I/V converters directly. In the fifth embodiment, the microprocessor 63 may also calculate the ratio A1/B1 directly.

In the second to fifth embodiments, instead of using the cut filter 4, as shown in FIGS. 4(b), (c), it may be also designed to set the lock point at two positions of transmission and reflection characteristic slopes. In this case, by the moving direction of the error signal, the emission wavelength may be controlled to one of the two lock points.

In the foregoing embodiments, the laser diode is used as the laser light source, but other laser light source may be also used. Or, instead of the photo coupler 2, various light splitting elements can be used.

In the fifth embodiment, instead of using the wavelength splitter 3A, the wavelength splitter 3 or 3B can be used to change the emission wavelength in a wide range.

What we claim is:

1. A wavelength stabilizing apparatus of laser light source comprising:

an optical filter composed as an interference optical filter laminating low refractive index films and high refractive index films having optical thicknesses of λ/4 for transmission wavelength λ on a substrate alternately in multiple layers, and continuously changing the optical thicknesses so that the transmission wavelength λ change continuously in a specific direction of the substrate, for receiving light of a laser light source capable of changing wavelength of light continuously, passing light of specific wavelength, and reflecting the other;

a first photo detector for receiving the light transmitted through said optical filter;

a second photo detector for receiving the light reflected by said optical filter;

an output ratio calculator which calculates the output ratio of reception levels delivered from said first and second photo detectors;

a wavelength controller which controls the emission wavelength of said laser light source in a manner that the output ratio by said output ratio calculator becomes a specified value; and a slide adjusting mechanism for changing the incident position of the incident light into said optical filter continuously in said specified direction.

2. A wavelength stabilizing apparatus of laser light source of claim 1, wherein said output ratio calculator comprises:

an adder for calculating the sum of the outputs of said first and second photo detectors;

a subtracter for calculating the difference of the outputs of said first and second photo detectors; and a divider for calculating the output ratio of said adder and said subtracter.

3. A wavelength stabilizing apparatus of laser light source of claim 1 wherein said wavelength controller comprises:

an error detector for detecting the difference of the output ratio calculated by said output ratio calculator and the specified reference value;

a reference value adjuster for setting reference value in said error detector; and a light source driver for controlling the emission wavelength of said laser light source in a manner that the error detected by said error detector becomes zero.

4. A wavelength stabilizing apparatus of laser light source of claim 3, wherein the reference value adjuster generates a reference value in a specified range.

5. A wavelength stabilizing apparatus of laser light source of claim 3, wherein said laser light source is a laser diode, and said light source driver changes the emission wavelength by changing the driving current supplied in said laser light source.

6. A wavelength stabilizing apparatus of laser light source of claim 3, wherein said laser light source is a laser diode, and said light source driver changes the emission wavelength by changing the temperature of said laser light source.

7. A wavelength stabilizing apparatus of laser light source of claim 1, wherein a cut filter of which cut-off wavelength is the transmission wavelength of said optical filter is provided between said laser light source and said optical filter.

8. A wavelength stabilizing apparatus of laser source comprising:

an optical filter for receiving light of a laser light source capable of changing wavelength of light continuously, passing light of specific wavelength, and reflecting the other;

a first photo detector for receiving the light transmitted through said optical filter;

a second photo detector for receiving the light reflected by said optical filter;

an output ratio calculator which calculates the output ratio of reception levels delivered from said first and second photo detectors; and a wavelength controller which controls the emission wavelength of said laser light source in a manner that the output ratio by said output ratio calculator becomes a specified value;

said wavelength controller comprising:

an adder for calculating the sum of the output of said first and second photo detectors;

a subtracter for calculating the difference of the outputs of said first and second photo detectors; and a divider for calculating the output ratio of said adder and said subtracter.

9. A wavelength stabilizing apparatus of laser light source of claim 8 further comprising an angle adjusting mechanism for changing the incident angle of said laser light into said optical filter.

10. A wavelength stabilizing apparatus of laser source comprising:

an optical filter for receiving light of a laser light source capable of changing wavelength of light continuously, passing light of specific wavelength, and reflecting the other;

a first photo detector for receiving the light transmitted through said optical filter;

a second photo detector for receiving the light reflected by said optical filter;

an output ratio calculator which calculates the output ratio of reception levels delivered from said first and second photo detectors; and a wavelength controller which controls the emission wavelength of said laser light source in a manner that the output ratio by said output ratio calculator becomes a specified value;

said wavelength controller comprising:

an error detector for detecting the difference of the output ratio calculated by said output ratio calculator and the specified reference value;

a reference value adjuster for setting reference value in said error detector; and a light source driver for controlling the emission wavelength of said laser light source in a manner that the error detected by said error detector becomes zero.

11. A wavelength stabilizing apparatus of laser light source of claim 10, wherein the reference value adjuster generates a reference value in a specified range.

12. A wavelength stabilizing apparatus of laser light source of claim 10, wherein said laser light source is a laser diode, and said light source driver changes the emission wavelength by changing the driving current supplied in said laser light source.

13. A wavelength stabilizing apparatus of laser light source of claim 10, wherein said laser light source is a laser diode, and said light source driver changes the emission wavelength by changing the temperature of said laser light source.

14. A wavelength stabilizing apparatus of laser light source of claim 10 further comprising an angle adjusting mechanism for changing the incident angle of said laser light into said optical filter.

15. A wavelength stabilizing apparatus of laser source comprising:

an optical filter for receiving light of a laser light source capable of changing wavelength of light continuously, passing light of specific wavelength, and reflecting the other;

a first photo detector for receiving the light transmitted through said optical filter;

a second photo detector for receiving the light reflected by said optical filter;

an angle adjusting mechanism for changing the incident angle of said laser light into said optical filter; and a processing unit which controls said laser light source based on the signals of said first and second photo detectors, for performing the following operations:
detecting the ratio of the outputs of said first and second photo detectors,
detecting the difference between said detected ratio and a predetermined reference value, and
outputting the control signal for controlling the emission wavelength of said laser light source in a manner that said difference becomes zero.

16. A wavelength stabilizing apparatus of laser light source comprising:

an optical filter composed as an interference optical filter laminating low refractive index films and high refractive index films having optical thicknesses of $\lambda/4$ for transmission wavelength $\lambda$ on a substrate alternately in multiple layers, and continuously changing the optical thicknesses so that the transmission wavelength $\lambda$ change continuously in a specific direction of the substrate, for receiving light of a laser light source capable of changing wavelength of light continuously, passing light of specific wavelength, and reflecting the other;

a first photo detector for receiving the light transmitted through said optical filter;

a second photo detector for receiving the light reflected by said optical filter;

a slide adjusting mechanism for changing the incident position of the incident light into said optical filter continuously in said specified direction; and a processing unit which controls said laser light source based on the signals of said first and second photo detectors, for performing the following operations:
detecting the ratio of the outputs of said first and second photo detectors,
detecting the difference between said detected ratio and a predetermined reference value, and
outputting the control signal for controlling the emission wavelength of said laser light source in a manner that said difference becomes zero.

* * * * *